(12) United States Patent
Deng et al.

(10) Patent No.: US 12,665,027 B2
(45) Date of Patent: Jun. 23, 2026

(54) MEMORY, OPERATION METHODS THEREOF AND MEMORY SYSTEMS

(71) Applicant: Yangtze Memory Technologies Co., Ltd., Wuhan (CN)

(72) Inventors: JiaLiang Deng, Wuhan (CN); ZhuQin Duan, Wuhan (CN); Lei Shi, Wuhan (CN); Jing Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 291 days.

(21) Appl. No.: 18/491,452

(22) Filed: Oct. 20, 2023

(65) Prior Publication Data

US 2025/0037769 A1 Jan. 30, 2025

(30) Foreign Application Priority Data

Jul. 24, 2023 (CN) .......................... 202310914461.9

(51) Int. Cl.
*G11C 16/08* (2006.01)
*G11C 16/04* (2006.01)
*G11C 16/26* (2006.01)
*G11C 16/34* (2006.01)

(52) U.S. Cl.
CPC .......... *G11C 16/08* (2013.01); *G11C 16/0483* (2013.01); *G11C 16/26* (2013.01); *G11C 16/3459* (2013.01)

(58) Field of Classification Search
CPC .................................................. G11C 16/3459
See application file for complete search history.

(56) References Cited

U.S. PATENT DOCUMENTS

2023/0134281 A1* 5/2023 Raimondo ......... G11C 16/3459
365/185.22

* cited by examiner

*Primary Examiner* — Jason Lappas
(74) *Attorney, Agent, or Firm* — Hanley, Flight & Zimmerman, LLC

(57) ABSTRACT

Examples of the present application provide a memory, an operation method thereof and a memory system, and relate to, but are not limited to, the field of storage technology. The memory includes a peripheral circuit, a plurality of word lines and a plurality of rows of memory cells. Each row of the memory cells is coupled with one word line. The peripheral circuit is configured to apply a first voltage to a first word line of the plurality of word lines in each of a plurality of first time periods. A second voltage is applied to the first word line in a second time period between every two adjacent ones of the plurality of first time periods, wherein the second voltage is configured to turn on the memory cells coupled with the first word line. As such, the accuracy of data reading can be improved.

20 Claims, 8 Drawing Sheets

Apply a first voltage to a first word line of the plurality of word lines in each of a plurality of first time periods          S110

Apply a second voltage to the first word line in a second time period between every two adjacent ones of the plurality of first time periods, wherein the second voltage is configured to turn on the memory cells coupled with the first word line          S120

| | |
|---|---|
| Apply a first voltage to a first word line of the plurality of word lines in each of a plurality of first time periods | S210 |
| Apply a second voltage to the first word line in a second time period between every two adjacent ones of the plurality of first time periods, wherein the second voltages applied in each of the second time periods are all equal | S220 |

MEMORY, OPERATION METHODS THEREOF AND MEMORY SYSTEMS

REFERENCE TO RELATED APPLICATIONS

This application claims priority to and the benefit of Chinese Patent Application 202310914461.9, filed on Jul. 24, 2023, which is hereby incorporated by reference in its entirety.

TECHNICAL FIELD

Examples of the present application relates to the field of storage technology, and particularly to a memory, an operation method thereof, and a memory system.

BACKGROUND

With the advancement of storage technology, computer flash memories (NAND) are applied more and more widely, for example, may be applied to an apparatus such as a cellphone, a computer, etc.

With the development of NAND memory, the number of bits stored by each memory cell is increasing. For example, each memory cell of a triple-level cell (TLC) flash can store 3 bits of data, corresponding to three pages: a lower page (LP), a middle page (MP) and an upper page (UP).

When data in the NAND memory is read, a read voltage is applied to a word line (WL). If the read voltage is greater than a threshold voltage of the memory cells coupled with the word line, the memory cells coupled with the word line are turned on. The data stored in the turned-on memory cells can be obtained according to the current on the bit line (BL) coupled with the turned-on memory cells.

DETAILED DESCRIPTION

Figure 1:
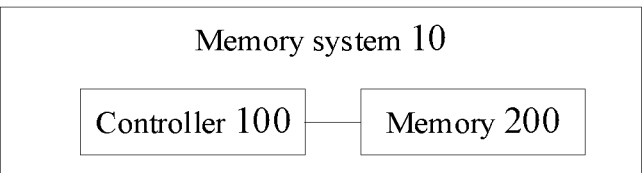
FIG. 1 is a schematic structure diagram of a memory system provided by examples of the present application.

The technical solutions in some examples of the present application will be described below clearly and completely in conjunction with the drawings. Apparently, the examples described are only part of, but not all of, the examples of the present application. All other examples obtained by those of ordinary skill in the art based on the examples provided by the present application shall fall in the scope of protection of the present application.

In the description of the present application, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of examples of the present application, "a plurality of" means two or more, unless otherwise stated.

When describing some examples, the term "couple" may be used to indicate that two or more components are in direct physical contact or electrical contact. However, the term "couple" may also mean that two or more components are not in direct contact with each other, but they still cooperate or interact with each other. The examples disclosed here are not necessarily limited to the content herein.

"At least one of A, B and C" and "at least one of A, B or C" have the same meaning, both including the following combinations of A, B and C: only A, only B, only C, a combination of A and B, a combination of A and C, a combination of B and C, and a combination of A, B and C. "A and/or B" includes the following three combinations: only A, only B, and a combination of A and B. The use of "suitable for" or "configured to" herein means open and inclusive language, and does not exclude an apparatus suitable for performing or configured to perform additional tasks or procedures.

Before introducing the examples of the present application, first, relevant technical terms and relevant technical background involved in the examples of the present application are introduced.

A memory may comprise a memory cell array. The memory cell array may comprise a plurality of memory blocks each comprising a plurality of memory cells. The memory may store data in the memory blocks in a sequential order or a random order. The memory in this example may comprise a computer flash memory (NAND). The memory may receive a command (CMD), an address (ADD) and data from a controller. The memory may receive an address sent by the controller, and perform an operation of a corresponding command on a region selected according to the address. For example, the memory may perform a write operation (a program operation), a read operation and an erase operation. During the program operation, the memory may program the data into the region selected according to the address. During the read operation, the memory may read the data from the region selected according to the address. During the erase operation, the memory may erase the data stored in the region selected according to the address.

FIG. 1 is a schematic structure diagram of a memory system provided by examples of the present application.

Generally, the memory system 10 may be applied in various electronic apparatuses. The memory system 10 may comprise one or more memories 200 and a controller 100 that are coupled. For instance, in an example, the controller 100 and a single memory 200 may be integrated in a memory card. The memory card may include a Personal Computer Memory Card International Association (PCMCIA) card, a Compact Flash (CF) card, a Smart Media (SM) card, a memory stick, a multimedia card (MMC), a Secure Digital (SD) card, a Universal Flash Storage (UFS), etc. The multimedia card may be divided into an MMC, a reduced-size MMC (RS-MMC), a micro MMC (MMCmicro), etc. The Secure Digital card includes an SD, a mini SD (miniSD), a micro SD (microSD), a high capacity Secure Digital card (SDHC), etc. Further, the memory card may also comprise a memory card connector coupling the memory card with a host. In an example, the controller 100 and a plurality of memories 200 may be integrated in a solid state disk (SSD). The SSD may further comprise an SSD connector coupling the SSD with the host. In some implementations, storage capacity and/or operating speed of the SSD is greater than storage capacity and/or operating speed of the memory card. In addition, the above-mentioned electronic apparatus may be any one of a cellphone, a desktop computer, a tablet computer, a notebook computer, a server, a vehicle apparatus, a wearable apparatus (e.g., a smart watch, a smart bracelet, smart glasses, etc.), a mobile power supply, a gaming machine, a digital multimedia player, etc., to which the examples of the present application impose no specific limitation.

Figure 2:
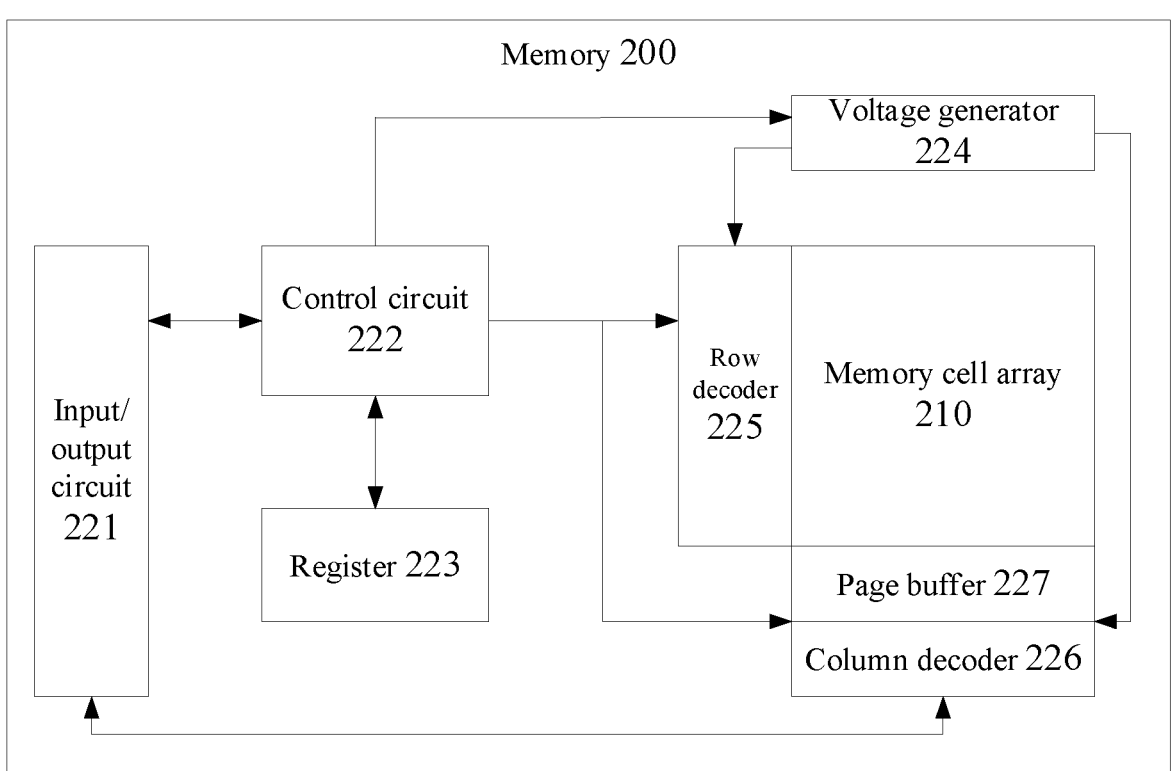
FIG. 2 is a schematic structure diagram of a memory provided by examples of the present application.

FIG. 2 is a schematic structure diagram of a memory provided by examples of the present application. Generally, the memory 200 comprises a memory cell array 210 and a peripheral circuit. The peripheral circuit comprises an input/output circuit 221, a control circuit 222, a register 223, a voltage generator 224, a row decoder 225, a column decoder 226 and a page buffer 227, etc.

The input/output circuit 221 is mainly used to receive a read instruction and a write instruction sent by the controller 100, and sends the read data to the controller 100, etc. The input/output circuit 221 may be coupled to the control circuit 222, and act as a control buffer to buffer and relay control commands received from a host to the control circuit 222, and buffer and relay state information received from the control circuit 222 to the host. The input/output circuit 221 may be also coupled to the column decoder 226 via a data bus and act as a data interface and a data buffer to buffer and relay the data to and from the memory cell array 210.

The control circuit 222 may be configured to control operations of the memory cell array 210 and the page buffer 227. The control circuit 222 is mainly used to control the row decoder 225 to turn on the voltage generator 224 with a corresponding word line according to the received read instruction, and to control the column decoder 226 to turn on the voltage generator 224 with a corresponding bit line to read the corresponding data.

The register 223 comprises an address register, a state register, etc. The address register is used to store a word line address and a string address, etc. in a read request instruction. The state register is used to store the current state of the memory 200, including both a ready state and a busy state. When the control circuit 222 is reading or writing data from or to the memory cell array 210, the state stored by the state register is the "busy" state, and a next read or write operation cannot be performed. When the memory cell array 210 finishes a read process or a write process, the state stored in the state register is switched to the "ready" state, and a next read or write operation can be performed.

The column decoder 226 may be configured to be controlled by the control circuit 222 and select one or more NAND memory strings by applying bit line voltages generated from the voltage generator 224.

The row decoder 225 may be configured to be controlled by the control circuit 222 and select/unselect the memory blocks of the memory cell array 210 and select/unselect word lines of the memory blocks. The row decoder 225 may be further configured to drive word lines using word line voltages generated from the voltage generator 224. In some implementations, the row decoder 225 may also select/unselect and drive source select gate lines and drain select gate lines. For example, the row decoder 225 is configured to perform erase operation on the memory cells coupled to (one or more) selected word lines. The voltage generator 224 may be configured to be controlled by the control circuit 222 and generate a word line voltage (such as, a read voltage, a write voltage, a pass voltage, a local voltage, a verify voltage, etc.), a bit line voltage and a source line voltage to be supplied to the memory cell array 210.

The page buffer 227 may be configured to read and write (program) data from and to the memory cell array 210 according to control signals from control circuit 222. In one example, the page buffer 227 may store one page of write data (program data) to be programmed into one memory page of the memory cell array 210. In another example, the page buffer 227 may perform program verify operation to ensure that the data has been properly programmed into the memory cells coupled to the selected word lines. In yet another example, the page buffer 227 may also sense a low power signal from the bit lines that represents a data bit stored in the memory cells, and amplify a small voltage swing to a recognizable logic level in the read operation.

Figure 3:
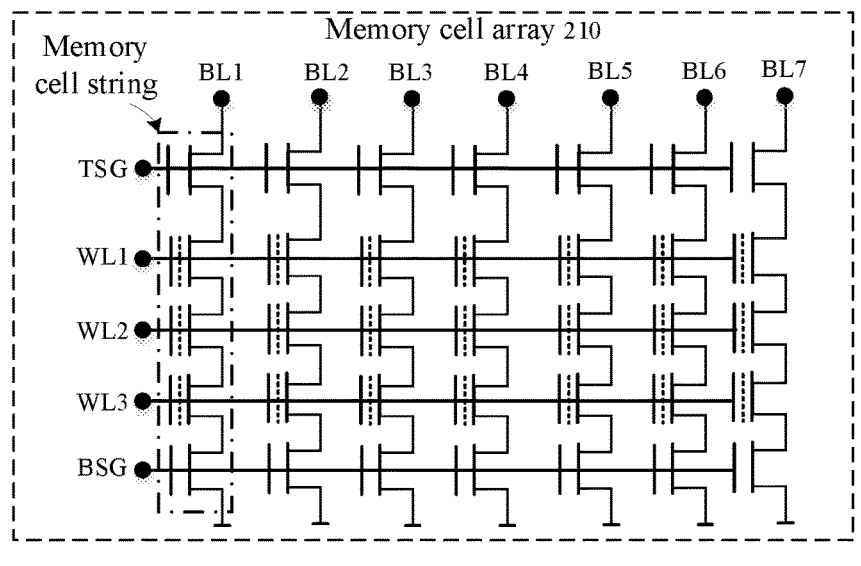
FIG. 3 is a schematic structure diagram of a memory cell array provided by examples of the present application.

FIG. 3 is a schematic structure diagram of a memory cell array provided by examples of the present application. The memory cell array 210 of the memory comprises a plurality of bit lines (BL): BL1, BL2, BL3, BL4, BL5, BL6, BL7, etc., and a plurality of word lines (WL): WL1, WL2, WL3, etc. Each memory cell is coupled with one of the word lines and one of the bit lines. When data is required to be read from the selected memory cell, a read voltage may be applied to the WL coupled to the selected memory cell, and a pass voltage is applied to the WLs coupled to the unselected memory cells.

With the development of the NAND memory, the number of bits of data stored by the memory cell increases from 1 bit to 2 bits, 3 bits, and 4 bits. Accordingly, the memory cell evolves from a single level cell (SLC) to a multiple level cell (MLC), a triple level cell (TLC), and a quad level cell (QLC). Accordingly, the number of data states in the memory increases from 2 to 4, 8, and 16, such that the capacity of the memory is increased, and its cost is lowered.

The memory cell of a SLC memory stores 1 bit of data. The data states of the memory cell of the SLC memory include 1 erase state labelled as E, and 1 program state labelled as P. A corresponding threshold voltage of the memory cell in the program state P is greater than a threshold voltage of the memory cell in the erase state E. The memory cell of an MLC memory stores 2 bits of data. The data states of the memory cell of the MLC memory include 1 erase state labelled as E, and 3 program states labelled as P1, P2 and P3 sequentially from a first state to a third state. The threshold voltage increases gradually from the P1 state to the P3 state. The memory cell of a TLC memory stores 3 bits of data. The data states of the memory cell of the TLC memory include 1 erase state labelled as E, and 7 program states labelled as P1, P2, P3, P4, P5, P6 and P7 sequentially from a first state to a seventh state. The threshold voltage of the memory cell from the P1 state to the P7 state increases gradually. The memory cell of a QLC memory stores 4 bits of data. The data states of the memory cell of the QLC memory include 1 erase state labelled as E, and 15 program states labelled as P1, P2, P3, P4, P5, P6, P7, P8, P9, P10, P11, P12, P13, P14 and P15 sequentially from a first state to a fifteenth state. The threshold voltage of the memory cell from the P1 state to the P15 state increases gradually.

When the memory cell is a QLC flash, each memory cell can store 4 bits of data, corresponding to four pages: a lower page (LP), a middle page (MP) and an upper page (UP), and an additional page (XP). In the memory, the data stored in the memory cell is read in the unit of pages.

When data reading is performed on a plurality of memory cells coupled to the word line, read voltage corresponding to each page is applied to the word line according to the sequence of each page. The read sequence of each page may be: a sequence of reading the LP first, then reading the MP, then reading the UP, and reading the XP at last. The sequence of each page may be also: a sequence of reading the LP first, then reading the UP, then reading the XP, and reading the MP at last, to which the examples of the present application do not impose limitations.

Figure 4:
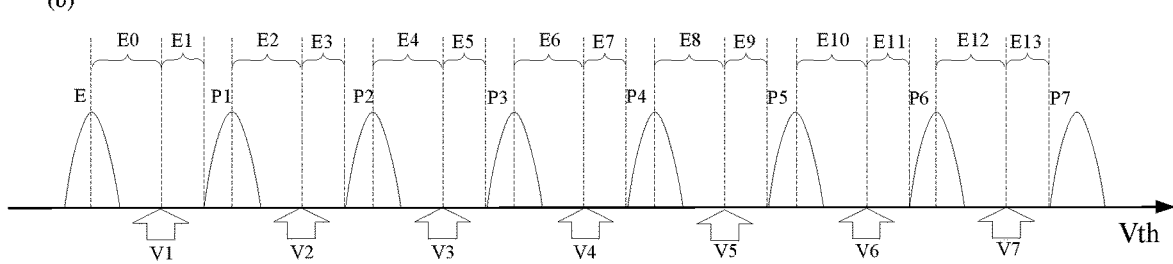
FIG. 4 is a normal distribution diagram of data states of a memory provided by examples of the present application.
Figure 5:
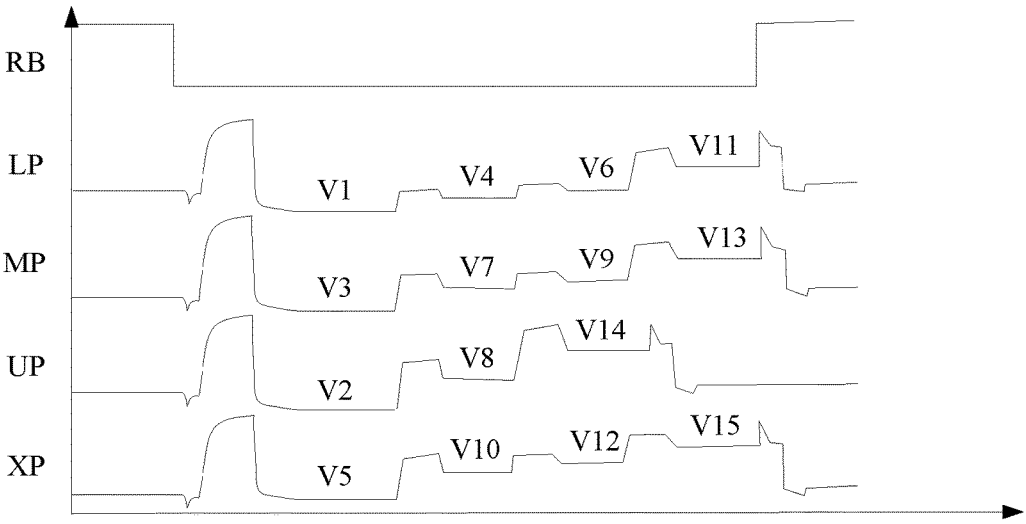
FIG. 5 is a schematic diagram I of a read voltage provided by examples of the present application.

FIG. 4 is a normal distribution diagram of data states of a memory provided by examples of the present application. In FIG. 4. (a) is a normal distribution diagram of data states of the QLC memory, and (b) is a normal distribution diagram of data states of the TLC memory. In both (a) and (b) of FIG. 4, abscissae are the threshold voltage, and ordinates are the number of memory cells. FIG. 5 is a schematic diagram I of a read voltage provided by examples of the present application. FIG. 5 shows a read voltage of the QLC memory, with the abscissa as time. As shown in FIG. 5, RB is a timing reference line, the read voltages corresponding to the LP are V1, V4, V6, and V11; the read voltages corresponding to the MP are V3, V7, V9 and V13; the read voltages corresponding to the UP are V2, V8 and V14; and the read voltages corresponding to the XP are V5, V10, V12 and V15.

After any read voltage corresponding to any page is applied to the word line every time, respective bits of data stored in the memory cells may be determined according to the turned-on states of the memory cells at different read voltages. As such, after each read voltage corresponding to each page is applied to the word line, a read result may be determined according to the determined bits of data stored in the memory cells.

Before reading, a pre-pulse voltage may be applied to the word line to clear the channel so as to solve the problem of hot carrier injection (HCI). Then, after induction is completed, a recovery pulse voltage may be applied to the word line to clear the channel again.

As shown in (b) of FIG. 4, the adjacent first data state (e.g., the E state) and second data state (e.g., the P1 state) correspond to a first read voltage. A first threshold edge space refers to a space between a corresponding threshold voltage at a peak number of memory cells in the first data state and the first read voltage.

For example, in the TLC memory as shown in (b) of FIG. 4, the first threshold edge space between the E state and the P1 state is E0, the first threshold edge space between the P1 state and the P2 state is E2, the first threshold edge space between the P2 state and the P3 state is E4, the first threshold edge space between the P3 state and the P4 state is E6, the first threshold edge space between the P4 state and the P5 state is E8, the first threshold edge space between the P5 state and the P6 state is E10, and the first threshold edge space between the P6 state and the P7 state is E12.

A second threshold edge space refers to a space between the first read voltage and a minimum threshold voltage of the memory cell in the second data state. For example, in the TLC memory as shown in (b) of FIG. 4, the second threshold edge space between the E state and the P1 state is E1, the second threshold edge space between the P1 state and the P2 state is E3, the second threshold edge space between the P2 state and the P3 state is E5, the second threshold edge space between the P3 state and the P4 state is E7, the second threshold edge space between the P4 state and the P5 state is E9, the second threshold edge space between the P5 state and the P6 state is E11, and the second threshold edge space between the P6 state and the P7 state is E13.

The threshold edge sum (ESUM) refers to a sum of the first threshold edge spaces except E0 and the second threshold edge spaces. For example, in the TLC memory as shown in (b) of FIG. 4. $ESUM=E1+E2+E3+E4+E5+E6+E7+E8+E9+E10+E11+E12+E13$.

In an actual read process, the read voltage applied to the word line may have an error. The smaller the ESUM is, the smaller the value range of the read voltage is, the more easily the data is misread. When multiple read voltages are applied to the word line, a forward read mode may be employed, i.e., the multiple read voltages increase sequentially, or a reverse read mode may be employed, i.e., the multiple read voltages decrease sequentially. A time of read (tR) of the forward reading is longer than that of the reverse read, and the ESUM is smaller, for example, the ESUM is smaller by 100 millivolts.

Figure 6:
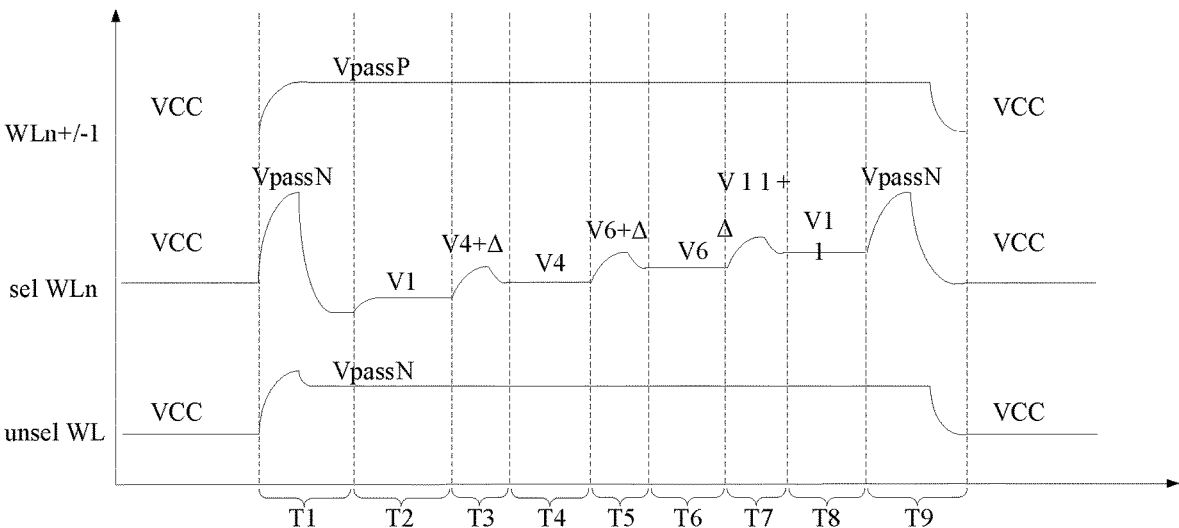
FIG. 6 is a schematic diagram II of a read voltage provided by examples of the present application.

FIG. 6 is a schematic diagram II of a read voltage provided by examples of the present application. The abscissa of FIG. 6 is time. VCC is an initial voltage. sel WLn is a selected (sel) word line, WLn+/−1 is a word line of unselected word lines adjacent to the WLn, and unsel WL is an unselected word line except the WLn+/−1. When the memory cell coupled with the WLn is read, a voltage is applied to the WLn, the WLn+/−1 and the unsel WL. By taking reading the LP as an example, V1, V4, V6 and V11 are applied to the word line respectively in multiple time periods by a read voltage (Vread) source, and an overcharge voltage is applied in a time period between applications of every two adjacent read voltages by the read voltage (Vread) source.

In an example, a pre-pulse voltage (e.g., VpassN) is applied to the WLn in a T1 time period. The read voltage V1 is applied to the WLn in a T2 time period, the read voltage V4 is applied to the WLn in a T4 time period, the read voltage V6 is applied to the WLn in a T6 time period, and the read voltage V11 is applied to the WLn in a T8 time period. An overcharge voltage V4+4 is applied to the WLn in a T3 time period, an overcharge voltage V6+Δ is applied to the WLn in a T5 time period, and an overcharge voltage V11+Δ is applied to the WLn in a T7 time period. A recovery pulse voltage (e.g., VpassN) is applied to the WLn in a T9 time period. From the T1 to T9 time periods, a pass voltage (e.g., VpassP) is applied to the WLn+/−1. From the T1 to T9 time periods, a pass voltage (e.g., VpassN) is applied to the unsel WL.

The overcharge voltage is slightly greater than the read voltage to be applied, for example, V4+Δ slightly greater than V4 is applied between V1 and V4. Since there is a capacitive load on the word line, V4+Δ is applied to the word line, such that the word line can reach V4 quickly, thereby reducing the read time. However, the ESUM of this approach is small, and the data could be easily misread.

Figure 7:
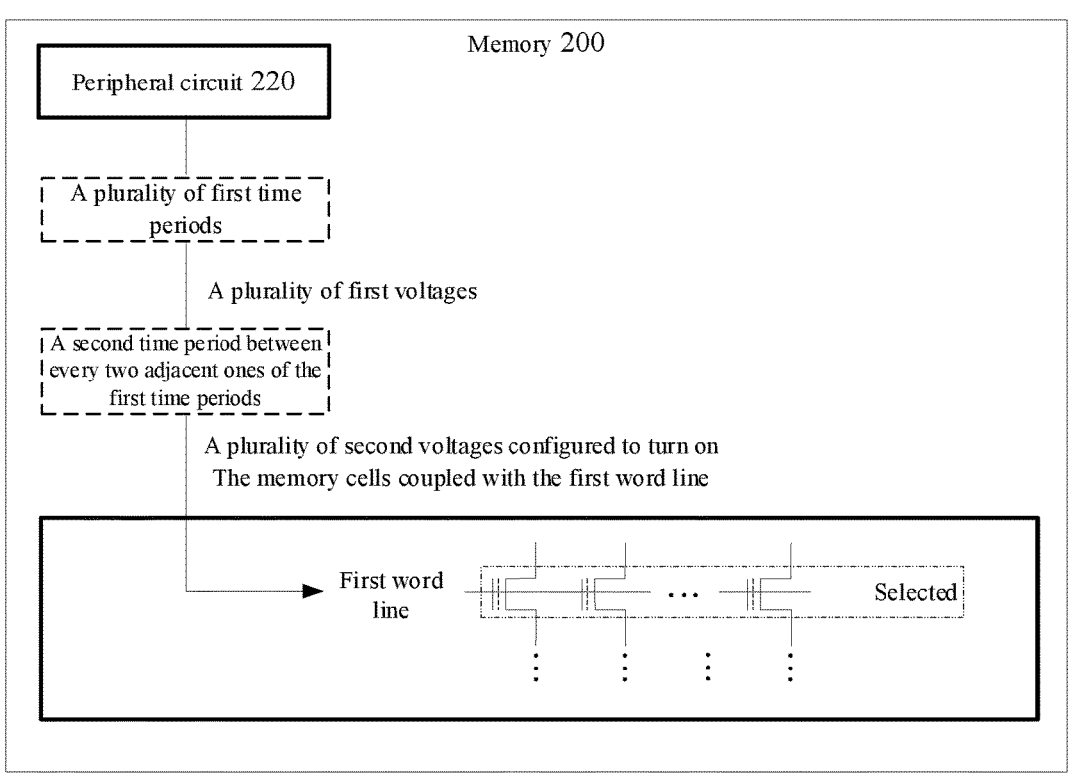
FIG. 7 is a schematic diagram I of a memory provided by examples of the present application.

On this basis, the examples of the present application provide a memory. FIG. 7 is a schematic diagram I of a memory provided by examples of the present application. The memory 200 comprises a peripheral circuit 220, a plurality of word lines and a plurality of rows of memory cells, wherein each row of the memory cells is coupled with one of the word lines. The peripheral circuit 220 is configured to:

apply a first voltage to a first word line of the plurality of word lines in each of a plurality of first time periods, and apply a second voltage to the first word line in a second time period between every two adjacent ones of the plurality of first time periods, wherein the second voltage is configured to turn on the memory cells coupled with the first word line.

The peripheral circuit 220 may at least comprise an input/output circuit 221, a control circuit 222, a register 223, a voltage generator 224, a row decoder 225, a column decoder 226 and a page buffer 227 as shown in FIG. 2, and other circuits. The peripheral circuit 220 may be further configured to receive a request from a controller 100 that is used to instruct to determine data of the memory cells coupled with the first word line. The first word line may be a selected word line (sel WLn) in the plurality of time periods determined according to the request.

Moreover, the number of the first voltages is greater than or equal to 2. The first voltage may be configured to determine the data stored in the memory cells coupled with the first word line.

The second voltage may be a pass voltage for turning on the memory cells coupled with the first word line when the first word line is an unselected word line. In each second time period of the plurality of time periods, the second voltage may serve as an overcharge voltage of the memory cells coupled with the first word line.

Figure 8:
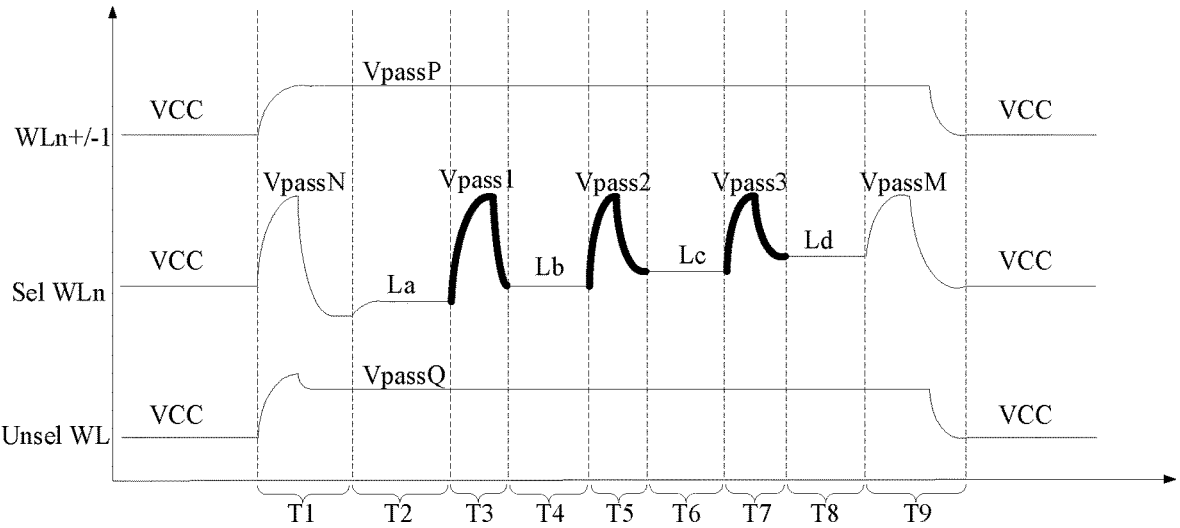
FIG. 8 is a schematic voltage diagram I provided by examples of the present application.

FIG. 8 is a schematic voltage diagram I provided by examples of the present application. Taking FIG. 8 as an example, the first time periods may include a T2 time period, a T4 time period, a T6 time period and a T8 time period. The second time periods may include a T3 time period, a T5 time period and a T7 time period. The first voltages may include La, Lb, Lc and Ld. The second voltages may include Vpass1, Vpass2 and Vpass3.

Before applying Lb to the first word line in the T4 time period, Vpass1 is applied to the first word line in the T3 time period. Before applying Lc to the first word line in the T6 time period, Vpass2 is applied to the first word line in the T5 time period. Before applying Ld to the first word line in the T8 time period, Vpass3 is applied to the first word line in the T7 time period. As such, the overcharge voltage may be increased to be greater than or equal to the pass voltage, such that voltage values before the first voltage are large. Not only can the channel be turned on, but also the voltage on the first word line can reach the first voltage quickly, the read time can be reduced (e.g., each read time is reduced by 10 microseconds), and the random telegraph noise (RTN) can be reduced, such that an ESUM of the memory cell coupled with the first word line is increased (for example, increased by 100 millivolts).

In the memory 200 provided by the examples of the present application, a first voltage is applied to the first word line of the plurality of word lines in each of the plurality of first time periods, and a second voltage is applied to the first word line in a second time period between every two adjacent ones of the plurality of first time periods, wherein the second voltage is configured to turn on the memory cells coupled with the first word line. The overcharge voltage of the memory cells coupled with the first word line is increased from a voltage "slightly greater than the read voltage to be applied" to "the second voltage configured to turn on the memory cells coupled with the first word line". As such, in an aspect, the channel can be better cleared. In another aspect, the voltage on the first word line can reach the first voltage quickly, thereby reducing voltage rising time and shortening read time. In yet another aspect, the random telegraph noise can be reduced, thereby increasing the ESUM, reducing the probability of data misreading and improving the data reliability. In still another aspect, this solution only needs to change the timing of electrical control, without increasing hardware costs.

In one possible implementation, the second voltages applied in each of the second time periods are all unequal. Taking FIG. 8 as an example, Vpass1, Vpass2 and Vpass3 are all unequal. Alternatively, the second voltages applied in at least two of the second time periods are unequal, for example, Vpass1 and Vpass2 are unequal.

In another possible implementation, the second voltages applied in each of the second time periods are all equal. Taking FIG. 8 as an example, Vpass1, Vpass2 and Vpass3 are all equal. In the memory 200 provided by the examples of the present application, the second voltages applied in each of the second time periods are all equal. As such, the same voltage source may be used to provide the second voltage, without increasing hardware costs.

In one possible implementation, the peripheral circuit 220 may comprise a first voltage source and a second voltage source. In the solution as shown in FIG. 6, the first voltage source may be used to output a read voltage and an overcharge voltage, for example, the first voltage source may be a read voltage (Vrd) source; and the second voltage source may be used to output a pass voltage, for example, the second voltage source may be a pass voltage (Vpass) source.

The second voltage source may be a bypass pass voltage source, and the second voltage source may be designed for the purpose of providing the pass voltage to a plurality of unselected word lines simultaneously. The driving capability of the second voltage source is stronger than the driving capability of the first voltage source, and a voltage provided by the second voltage source is higher than a voltage provided by the first voltage source.

In the memory 200 provided by the examples of the present application, the first voltage source is used to output the first voltages in the plurality of first time periods, and the second voltage source is used to output the second voltages in the plurality of second time periods. In an example, the first word line is coupled with both the first voltage source and the second voltage source. A first voltage is applied to the first word line by the first voltage source in a first one of the first time periods. It is switched to the second voltage source to apply one of the second voltages to the first word line in a first one of the second time periods. It is switched to the first voltage source to apply one of the first voltages to the first word line in a second one of the first time periods. As such, it provides a basis to apply the second voltages.

In one possible implementation, the peripheral circuit 220 is further configured to apply a pre-pulse voltage to the first word line before applying a first one of the first voltages, wherein the second voltage applied in at least one of the second time periods is equal to the pre-pulse voltage.

As shown in FIG. 8, in the T1 time period, the pre-pulse voltage (e.g., VpassN) is applied to the first word line, so as to clear the channel. The second voltage applied in at least one of the second time periods is equal to the pre-pulse voltage, that is, at least one of Vpass1, Vpass2 and Vpass3 is equal to VpassN.

In the memory 200 provided by the examples of the present application, the pre-pulse voltage is applied to the first word line before applying the first one of the first voltages, wherein the second voltage applied in at least one of the second time periods is equal to pre-pulse voltage. As such, the same voltage source can be used to provide the pre-pulse voltage and the second voltage, without increasing hardware costs.

In one possible implementation, the peripheral circuit 220 is further configured to apply a recovery pulse voltage to the first word line after applying a last one of the first voltages, wherein the second voltage applied in at least one of the second time periods is equal to the recovery pulse voltage.

As shown in FIG. 8, in the T9 time period, the recovery pulse voltage (e.g., VpassM) is applied to the first word line, so as to clear the channel. The second voltage applied in at least one of the second time periods is equal to the recovery pulse voltage, that is, at least one of Vpass1, Vpass2 and Vpass3 is equal to VpassM. In an example, the recovery pulse voltage may be equal to the pre-pulse voltage.

In the memory 200 provided by the examples of the present application, the recovery pulse voltage is applied to the first word line after applying the last one of the first voltages, wherein the second voltage applied in at least one of the second time periods is equal to the recovery pulse voltage. As such, the same voltage source can be used to provide the recovery pulse voltage and the second voltage, without increasing hardware costs.

In one possible implementation, the peripheral circuit 220 is further configured to apply the pre-pulse voltage to the first word line before applying the first one of the first voltages. The recovery pulse voltage is applied to the first word line after applying the last one of the first voltages. The second voltages applied in at least one of the second time periods are all equal. The second voltage applied in at least one of the second time periods is unequal to the pre-pulse voltage, and/or the second voltage is unequal to the recovery pulse voltage. As shown in FIG. 8, Vpass1. Vpass2 and Vpass3 are all equal, Vpass1 is unequal to VpassN, and/or Vpass1 is unequal to VpassM.

In one possible implementation, the first voltage is configured to read the data of the memory cells coupled with the first word line. In an example, the peripheral circuit 220 may be configured to receive a read request from the controller 100. The read request is used to instruct to read the data of the memory cells coupled with the first word line, and comprises an address of the data to be read. The peripheral circuit 220 receives the read request, and determines the selected first word line according to the address in the read request, so as to apply a corresponding voltage to the first word line. Taking FIG. 8 as an example, the first voltages La, Lb, Lc, Ld may be read voltages for reading the data of the memory cells coupled with the first word line.

In the memory 200 provided by the examples of the present application, the first voltage is configured to read the data of the memory cells coupled with the first word line. Therefore, the solution may be applied to an application scenario where the memory 200 reads data. During reading of the data of the memory cells coupled with the first word line, the channel is better cleared, the read time is shortened, and the data reliability is improved.

In one possible implementation, the first voltage is configured to verify the data of the memory cells coupled with the first word line during programming. In an example, the peripheral circuit 220 may be configured to receive a programming request from the controller 100. The programming request is used to instruct to write data to the memory cells coupled with the first word line, and comprises an address of the data to be written. The peripheral circuit 220 receives the programming request, and determines the selected first word line according to the address in the programming request, so as to apply a corresponding voltage to the first word line in a verify stage during programming. The first voltage may be a verify voltage for verifying the data of the memory cells coupled with the first word line.

Figure 9:
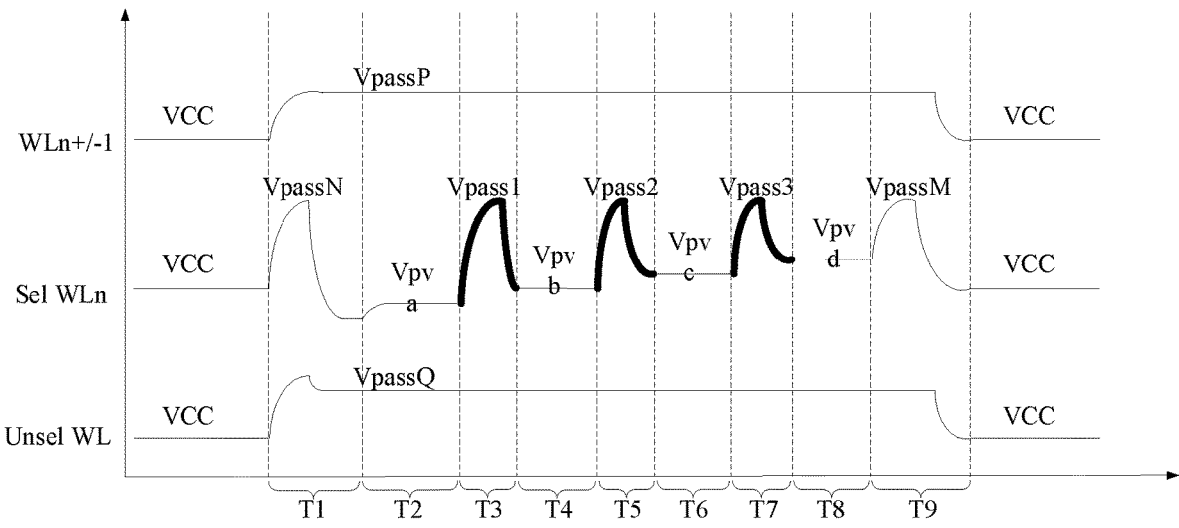
FIG. 9 is a schematic voltage diagram II provided by examples of the present application.

FIG. 9 is a schematic voltage diagram II provided by examples of the present application. Taking FIG. 9 as an example, the first time periods may include a T2 time period, a T4 time period, a T6 time period and a T8 time period. The second time periods may include a T3 time period, a T5 time period and a T7 time period. The first voltages may include Vpv a, Vpv b, Vpv c, and Vpv d, and the first voltages may be verify voltages. The second voltage may include Vpass1, Vpass2 and Vpass3. Vpass1 is applied in the T3 time period before applying the verify voltage Vpv b in the T4 time period. Vpass2 is applied in the T5 time period before applying the verify voltage Vpv c in the T6 time period. Vpass3 is applied in the T7 time period before applying the verify voltage Vpv d in the T8 time period.

In the memory 200 provided by the examples of the present application, the first voltage is configured to verify the data of the memory cells coupled with the first word line during programming. Therefore, the solution may be applied to an application scenario where the memory 200 verifies data during programming. During verifying of the data of the memory cells coupled with the first word line, the channel is better cleared, the read time is shortened, and the data reliability is improved.

In one possible implementation, the plurality of first voltages increase sequentially. That is, the solution employs a forward reading or forward verifying mode. In the memory 200 provided by the examples of the present application, the plurality of first voltages increase sequentially. As such, the solution may be applied to an application scenario of forward reading or forward verifying. During the process of forward reading or forward verifying, an overcharge voltage may be boosted to be greater than or equal to a pass voltage, to better clear the channel, shorten the read time and improve the data reliability.

Figure 10:
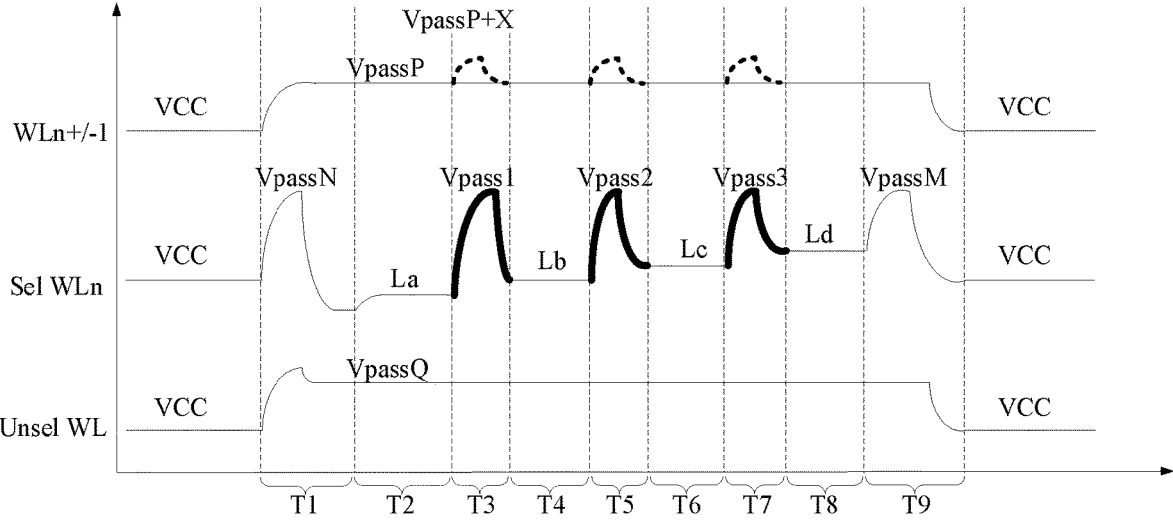
FIG. 10 is a schematic voltage diagram III provided by examples of the present application.

Moreover, the pass voltage (e.g., VpassP) is applied to the word line WLn+/−1 adjacent to the first word line to turn on the memory cells coupled with the WLn+/−1, to provide a basis for a bit line to detect current. FIG. 10 is a schematic voltage diagram III provided by examples of the present application. In each of the second time periods, the pass voltage VpassP is applied to the WLn+/−1. Since the WLn+/−1 is adjacent to the first word line, the WLn+/−1 will be coupled by the first word line, and an actual voltage of the WLn+/−1 is VpassP+X as shown in dotted lines.

When the WLn+/−1 is coupled by the first word line, the read Vpass disturb will be increased, and a block level read voltage in a reliability test will be decreased. When pages of the WLn+/−1 are read continuously for 1.5M times, the single page read disturb of the WLn+/−1 is particularly serious. Similar to the ESUM, the smaller E0 is, the more easily the data is misread. The greater the read Vpass disturb is, the smaller the ESUM and E0 of the memory cells coupled with the WLn+/−1 arc.

In one possible implementation, the plurality of word lines further include a second word line that is adjacent to the first word line. The peripheral circuit 220 is further configured to apply a third voltage to the second word line in each of the first time periods, wherein the third voltage is configured to turn on the memory cells coupled with the second word line. A fourth voltage is applied to the second word line in each of the second time periods, wherein the fourth voltage is less than the third voltage.

Figure 11:
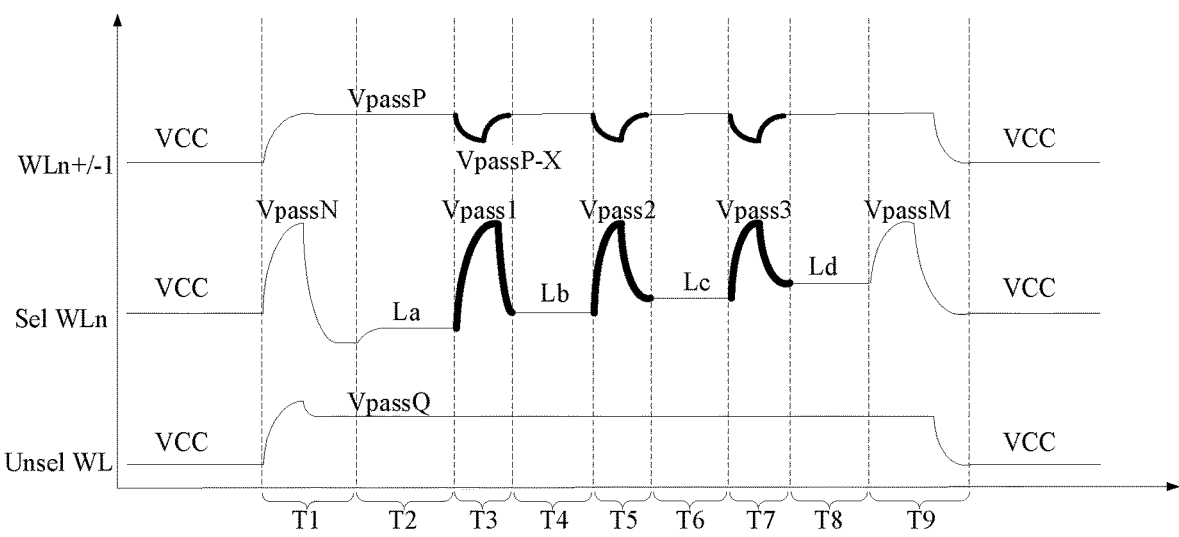
FIG. 11 is a schematic voltage diagram IV provided by examples of the present application.

The second word line may be one of the word lines WLn+/−1 of the unselected word lines adjacent to the first word line. FIG. 11 is a schematic voltage diagram IV provided by examples of the present application. In order avoid too much loss of the ESUM and E0 of the second word line, the fourth voltage (e.g., VpassP-X) is applied to the second word line in each of the second time periods, and an actual voltage of the second word line may be the third voltage (e.g., VpassP) or other pass voltages. Thus, the read Vpass disturb caused by the coupling of the second word line and the first word line can be cancelled. The examples of the present application do not limit the magnitude relationship of the third voltage and the fourth voltage.

In the memory 200 provided by the examples of the present application, the third voltage is applied to the second word line adjacent to the first word line in each of the first time periods, and the fourth voltage less than the third voltage is applied to the second word line in each of the second time periods. Since the second word line will be coupled by the first word line in each of the second time periods (when the first word line is overcharged), in fact, the voltage of the second word line will increase. By reducing the voltage applied to the second word line in the second time period, the read Vpass disturb caused by the coupling of the second word line and the first word line is cancelled, and the ESUM and E0 of the memory cells coupled with the second word line are prevented from decreasing, thus ensuring the data reliability of the memory 200.

In one possible implementation, the plurality of word lines further include a third word line that is not adjacent to the first word line. The peripheral circuit 220 is further configured to:

apply a fifth voltage to the third word line in each of the first time periods and each of the second time periods, wherein the fifth voltage is configured to turn on the memory cells coupled with the third word line.

The third word line may be one of the unselected word lines not adjacent to the first word line. The fifth voltage may be a pass voltage (e.g., VpassQ).

In the memory 200 provided by the examples of the present application, the fifth voltage is applied to the third word line not adjacent to the first word line, wherein the fifth voltage is configured to turn on the memory cells coupled with the third word line. As such, the memory cells coupled with the third word line can be turned on to provide a basis for a bit line to detect current.

In one possible implementation, at least two of VpassN, VpassM. VpassP, VpassQ, Vpass1, Vpass2 and Vpass3 may be equal. In another possible implementation, all of VpassN, VpassM. VpassP, VpassQ, Vpass1, Vpass2 and Vpass3 may be unequal.

Figure 12:
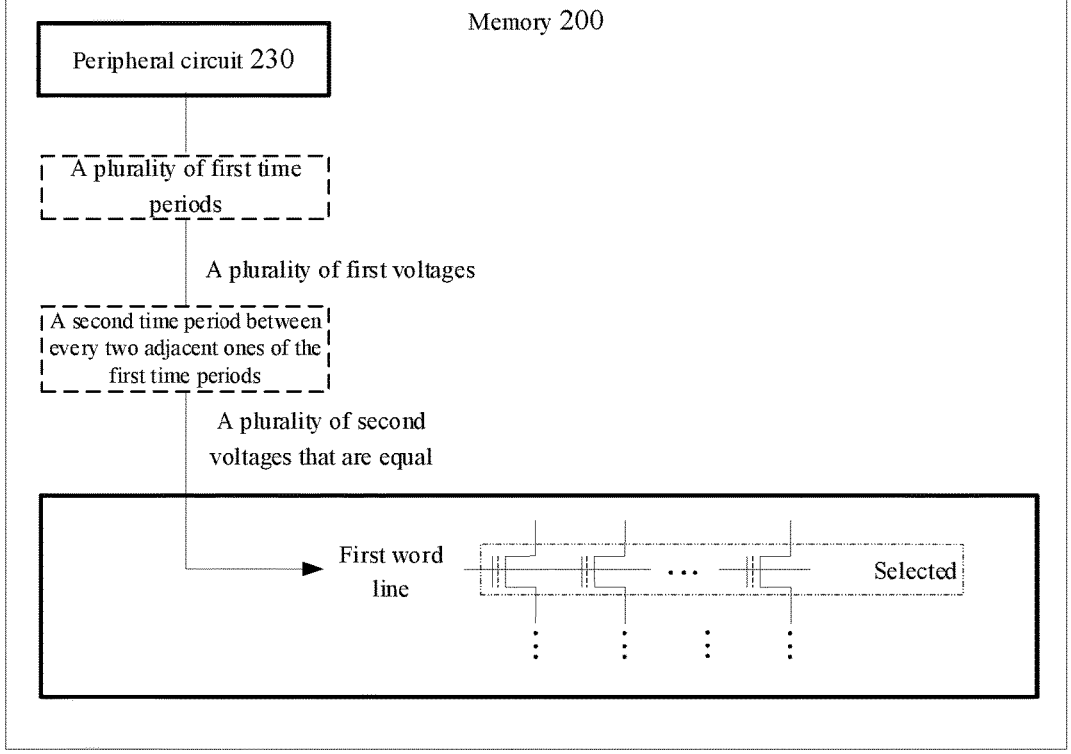
FIG. 12 is a schematic diagram II of a memory provided by examples of the present application.

Examples of the present application further provide a memory. FIG. 12 is a schematic diagram II of a memory provided by examples of the present application. The memory 200 comprises a peripheral circuit 230, a plurality of word lines and a plurality of rows of memory cells, wherein each row of the memory cells is coupled with one of the word lines. The peripheral circuit 230 is configured to:

apply a first voltage to a first word line of the plurality of word lines in each of a plurality of first time periods, and apply a second voltage to the first word line in a second time period between every two adjacent ones of the plurality of first time periods, wherein the second voltages applied in each of the second time periods are all equal.

The first voltage may be configured to determine data of the memory cells coupled with the first word line. The description of the peripheral circuit 230, the first word line, the first voltage and the second voltage may refer to the description of the peripheral circuit 230, the first word line, the first voltage and the second voltage in the aforementioned examples, which will not be repeated here by the examples of the present application.

Figure 13:
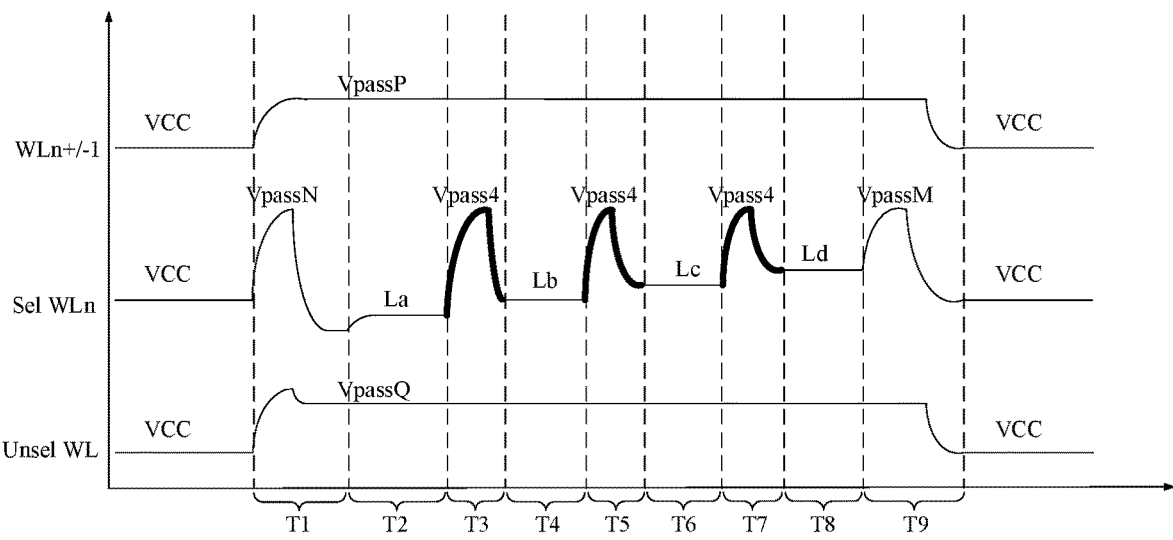
FIG. 13 is a schematic voltage diagram V provided by examples of the present application.

FIG. 13 is a schematic voltage diagram V provided by examples of the present application. Taking FIG. 13 as an example, the first time periods may include a T2 time period, a T4 time period, a T6 time period and a T8 time period. The second time periods may include a T3 time period, a T5 time period and a T7 time period. The first voltages may include La, Lb, Lc and Ld. The second voltage may include Vpass4. As can be seen, the second voltages applied in each of the second time periods are all equal.

Before applying Lb to the first word line in the T4 time period, Vpass4 is applied to the first word line in the T3 time period. Before applying Lc to the first word line in the T6 time period, Vpass4 is applied to the first word line in the T5 time period. Before applying Ld to the first word line in the T8 time period, Vpass4 is applied to the first word line in the T7 time period. As such, the overcharge voltage may be increased, such that voltage values before the first voltage are large. Not only can the channel be turned on, but also a voltage on the first word line can reach the first voltage quickly, the read time is reduced (e.g., the time of each read is reduced by 10 microseconds), and the random telegraph noise (RTN) can be reduced, such that an ESUM of the memory cells coupled with the first word line is increased (for example, increased by 100 millivolts).

In the memory 200 provided by the examples of the present application, a first voltage is applied to the first word line of the plurality of word lines in each of the plurality of first time periods, and a second voltage is applied to the first word line in the second time period between every two adjacent ones of the plurality of first time periods, wherein the second voltages applied in each of the second time periods are all equal. As such, in an aspect, the channel can be better cleared. In another aspect, the voltage on the first word line can reach the first voltage quickly, thereby reducing voltage rising time and shortening read time. In yet another aspect, the random telegraph noise can be reduced, thereby increasing the ESUM, reducing the probability of data misreading and improving the data reliability. In still another aspect, this solution only needs to change the timing of electrical control, and the same voltage source can be used to provide the second voltage, without increasing hardware costs.

In one possible implementation, the second voltages applied in each of the second time periods are greater than any first voltage adjacent to the second voltage. The second voltages may be overcharge voltages, and each of the second voltages is greater than the first voltage to be applied. Taking FIG. 13 as an example, Vpass4 is greater than the maximum one of La, Lb, Lc and Ld.

In the memory 200 provided by the examples of the present application, the second voltages applied in each of the second time periods are greater than any first voltage adjacent to the second voltage. The second voltage is increased from being "slightly greater than the read voltage to be applied" to "be greater than the maximum one of the plurality of first voltages", so as to provide a basis for increasing the second voltage to achieve effects of clearing the channel, shortening the read time and improving the data reliability, etc.

In one possible implementation, the second voltage is configured to turn on the memory cells coupled with the first word line. The description of the second voltage may refer to the description of the second voltage in the aforementioned examples, which will not be repeated here by the examples of the present application.

In the memory 200 provided by the examples of the present application, the second voltage is configured to turn on the memory cells coupled with the first word line. The overcharge voltage of the memory cells coupled with the first word line is increased from being "slightly greater than the read voltage to be applied" to "the second voltage configured to turn on the memory cells coupled with the first word line", to provide a basis for increasing the overcharge voltage to achieve effects of clearing the channel, shortening the read time and improving the data reliability, etc.

In one possible implementation, the peripheral circuit 230 may comprise a first voltage source and a second voltage source. The description of the first voltage source and the second voltage source may refer to the description in the aforementioned examples, which will not be repeated here by the examples of the present application.

In one possible implementation, the peripheral circuit 230 is further configured to apply a pre-pulse voltage to the first word line before applying a first one of the first voltages, wherein the second voltage applied in at least one of the second time periods is equal to the pre-pulse voltage. The description of the pre-pulse voltage may refer to the description of the pre-pulse voltage in the aforementioned examples, which will not be repeated here by the examples of the present application.

In the memory 200 provided by the examples of the present application, the pre-pulse voltage is applied to the first word line before applying the first one of the first voltages, wherein the second voltage applied in at least one of the second time periods is equal to pre-pulse voltage. As such, the same voltage source can be used to provide the pre-pulse voltage and the second voltage, without increasing hardware costs.

In one possible implementation, the peripheral circuit 230 is further configured to apply a recovery pulse voltage to the first word line after applying a last one of the first voltages, wherein the second voltage applied in at least one of the second time periods is equal to the recovery pulse voltage. The description of the pre-pulse voltage may refer to the description of the pre-pulse voltage in the aforementioned examples, which will not be repeated here by the examples of the present application.

In the memory 200 provided by the examples of the present application, the recovery pulse voltage is applied to the first word line after applying the last one of the first voltages, wherein the second voltage applied in at least one of the second time periods is equal to the recovery pulse voltage. As such, the same voltage source can be used to provide the recovery pulse voltage and the second voltage, without increasing hardware costs.

In one possible implementation, the peripheral circuit 230 is further configured to apply the pre-pulse voltage to the first word line before applying the first one of the first voltages. The recovery pulse voltage is applied to the first word line after applying the last one of the first voltages. The second voltages applied in at least one of the second time periods are all equal. The second voltage applied in at least one of the second time periods is unequal to the pre-pulse voltage, and/or the second voltage is unequal to the recovery pulse voltage.

In one possible implementation, the first voltage is configured to read the data of the memory cells coupled with the first word line. The description of the read process may refer to the description in the aforementioned examples, which will not be repeated here by the examples of the present application.

In the memory 200 provided by the examples of the present application, the first voltage is configured to read the data of the memory cells coupled with the first word line. Therefore, the solution may be applied to an application scenario where the memory 200 reads data. During reading of the data of the memory cells coupled with the first word line, the channel is better cleared, the read time is shortened, and the data reliability is improved.

In one possible implementation, the first voltage is configured to verify the data of the memory cells coupled with the first word line during programming. The description of the program verify process may refer to the description in the aforementioned examples, which will not be repeated here by the examples of the present application.

In the memory 200 provided by the examples of the present application, the first voltage is configured to verify the data of the memory cells coupled with the first word line during programming. Therefore, the solution may be applied to an application scenario where the memory 200 verifies data during programming. During verifying of the data of the memory cells coupled with the first word line, the channel is better cleared, the read time is shortened, and the data reliability is improved.

In one possible implementation, the plurality of first voltages increase sequentially. In the memory 200 provided by the examples of the present application, the plurality of first voltages increase sequentially. As such, the solution may be applied to an application scenario of forward reading or forward verifying. During the process of forward reading or forward verifying, the channel is better cleared, the read time is shortened, and the data reliability is improved.

In one possible implementation, the plurality of word lines further include a second word line that is adjacent to the first word line. The peripheral circuit 230 is further configured to apply a third voltage to the second word line in each of the first time periods, wherein the third voltage is configured to turn on the memory cells coupled with the second word line. A fourth voltage is applied to the second word line in each of the second time periods, and is configured to turn on the memory cells coupled with the second word line. The fourth voltage is less than the third voltage.

The description of the second word line, the third voltage and the fourth voltage may refer to the description of the second word line, the third voltage and the fourth voltage in the aforementioned examples, which will not be repeated here by the examples of the present application.

In the memory 200 provided by the examples of the present application, the third voltage is applied to the second word line adjacent to the first word line in each of the first time periods, and the fourth voltage less than the third voltage is applied to the second word line in each of the second time periods. Since the second word line will be coupled by the first word line in each of the second time periods (when the first word line is overcharged), in fact, the voltage of the second word line will increase. By reducing the voltage applied to the second word line in the second time period, the read Vpass disturb caused by the coupling of the second word line and the first word line is cancelled, and the ESUM and E0 of the memory cells coupled with the second word line are prevented from decreasing, thus ensuring the data reliability of the memory 200.

In one possible implementation, the plurality of word lines further include a third word line that is not adjacent to the first word line. The peripheral circuit 230 is further configured to apply a fifth voltage to the third word line in each of the first time periods and each of the second time periods, wherein the fifth voltage is configured to turn on the memory cells coupled with the third word line.

The description of the third word line and the fifth voltage may refer to the description of the third word line and the fifth voltage in the aforementioned examples, which will not be repeated here by the examples of the present application.

In the memory 200 provided by the examples of the present application, the fifth voltage is applied to the third word line not adjacent to the first word line, wherein the fifth voltage is configured to turn on the memory cells coupled with the third word line. As such, the memory cells coupled with the third word line can be turned on to provide a basis for a bit line to detect current.

Figure 14:
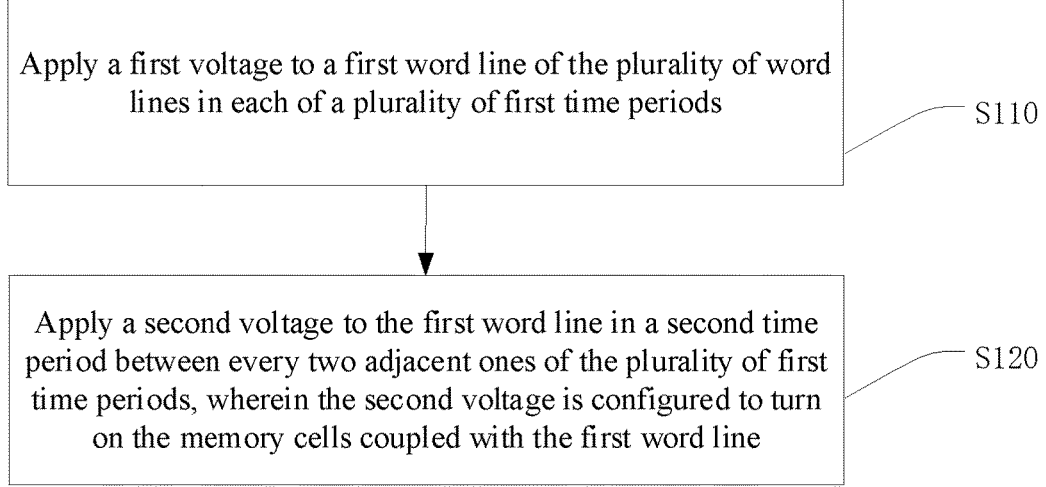
FIG. 14 is a flow diagram I of an operation method of a memory provided by examples of the present application.

Examples of the present application further provide an operation method of a memory. FIG. 14 is a flow diagram I of an operation method of a memory provided by examples of the present application. The memory 200 comprises a peripheral circuit 220, a plurality of word lines and a plurality of rows of memory cells, wherein each row of the memory cells is coupled with one of the word lines. The method may be applied to the peripheral circuit 220, and comprises operations S110 and S120.

> S110: A first voltage is applied to a first word line of the plurality of word lines in each of a plurality of first time periods.
>
> S120: A second voltage is applied to the first word line in a second time period between every two adjacent ones of the plurality of first time periods, wherein the second voltage is configured to turn on the memory cells coupled with the first word line.

In one possible implementation, the second voltages applied in each of the second time periods are all equal.

In one possible implementation, the method further comprises: applying a pre-pulse voltage to the first word line before applying a first one of the first voltages, wherein the second voltage applied in at least one of the second time periods is equal to the pre-pulse voltage.

In one possible implementation, the method further comprises: applying a recovery pulse voltage to the first word line after applying a last one of the first voltages, wherein the second voltage applied in at least one of the second time periods is equal to the recovery pulse voltage.

In one possible implementation, the first voltage is configured to read the data of the memory cells coupled with the first word line.

In one possible implementation, the first voltage is configured to verify the data of the memory cells coupled with the first word line during programming.

In one possible implementation, the plurality of first voltages increase sequentially.

In one possible implementation, the plurality of word lines further include a second word line that is adjacent to the first word line. The method further comprises: applying a third voltage to the second word line in each of the first time periods, wherein the third voltage is configured to turn on the memory cells coupled with the second word line. A fourth voltage is applied to the second word line in each of the second time periods, and is configured to turn on the time periods, wherein the third voltage is configured to turn on the memory cells coupled with the second word line. A fourth voltage is applied to the second word line in each of the second time periods, wherein the fourth voltage is less than the third voltage.

In one possible implementation, the plurality of word lines further include a third word line that is not adjacent to the first word line. The method further comprises: applying a fifth voltage to the third word line in each of the first time periods and each of the second time periods, wherein the fifth voltage is configured to turn on the memory cells coupled with the third word line.

The operation method of the memory provided by the examples of the present application may be applied to the above-mentioned memory 200 to achieve the functions and effects of the above-mentioned memory 200. Since detailed description has been made in the aforementioned examples of the memory 200, it is not repeated any longer here.

Figure 15:
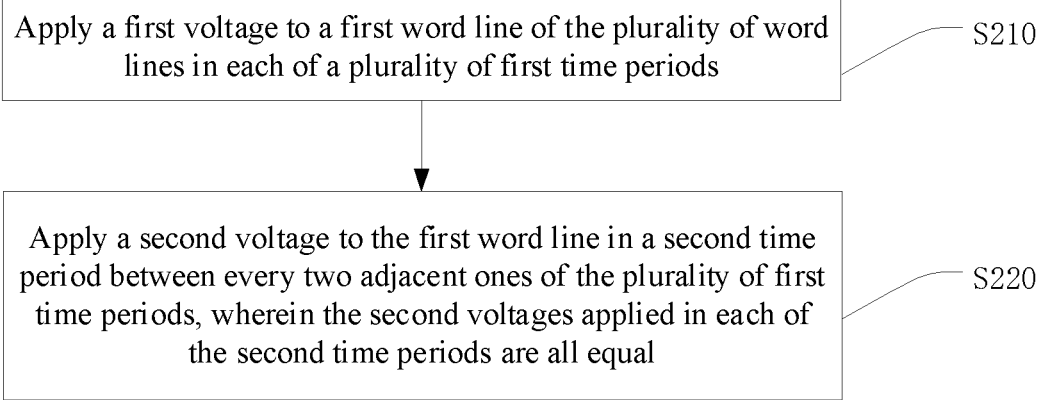
FIG. 15 is a flow diagram II of an operation method of a memory provided by examples of the present application.

Examples of the present application further provide an operation method of a memory. FIG. 15 is a flow diagram II of an operation method of a memory provided by examples of the present application. The memory 200 comprises a peripheral circuit 230, a plurality of word lines and a plurality of rows of memory cells, wherein each row of memory cells is coupled with one of the word lines. The method may be applied to the peripheral circuit 230, and comprises operations S210 and S220.

> S210: A first voltage is applied to a first word line of the plurality of word lines in each of a plurality of first time periods.
>
> S220: A second voltage is applied to the first word line in a second time period between every two adjacent ones of the plurality of first time periods, wherein the second voltages applied in each of the second time periods are all equal.

In one possible implementation, the second voltages applied in each of the second time periods are greater than any first voltage adjacent to the second voltage.

In one possible implementation, the second voltage is configured to turn on the memory cells coupled with the first word line.

In one possible implementation, the method further comprises: applying a pre-pulse voltage to the first word line before applying a first one of the first voltages, wherein the second voltage applied in at least one of the second time periods is equal to the pre-pulse voltage.

In one possible implementation, the method further comprises: applying a recovery pulse voltage to the first word line after applying a last one of the first voltages, wherein the second voltage applied in at least one of the second time periods is equal to the recovery pulse voltage.

In one possible implementation, the first voltage is configured to read the data of the memory cells coupled with the first word line.

In one possible implementation, the first voltage is configured to verify the data of the memory cells coupled with the first word line during programming.

In one possible implementation, the plurality of first voltages increase sequentially.

In one possible implementation, the plurality of word lines further include a second word line that is adjacent to the first word line. The method further comprises: applying a third voltage to the second word line in each of the first time periods, wherein the third voltage is configured to turn on the memory cells coupled with the second word line. A fourth voltage is applied to the second word line in each of the second time periods, and is configured to turn on the memory cells coupled with the second word line. The fourth voltage is less than the third voltage.

In one possible implementation, the plurality of word lines further include a third word line that is not adjacent to the first word line. The method further comprises: applying a fifth voltage to the third word line in each of the first time periods and each of the second time periods, wherein the fifth voltage is configured to turn on the memory cells coupled with the third word line.

The operation method of the memory 200 provided by the examples of the present application may be applied to the above-mentioned memory 200 to achieve the functions and effects of the above-mentioned memory 200. Since detailed description has been made in the aforementioned examples of the memory 200, it is not repeated any longer here.

Examples of the present application further provide a memory system, and the structure of the memory system may refer to the memory system 10 in FIG. 1. The memory system comprises a controller 100 and the memory 200 in the above examples. The number of the memory 200 may be 1 or more than one.

The controller 100 may at least comprise an interface (I/F) circuit, a read-only memory (ROM), a processor circuit, an accelerator, a buffer, an Error Checking and Correcting Engine, a flash controller circuit, and other circuits.

The memory 200 may comprise the peripheral circuit 220 or the peripheral circuit 230 in the above examples, and may also comprise a plurality of word lines and a plurality of rows of memory cells, wherein each row of the memory cells is coupled with one of the word lines. The peripheral circuit 220 or the peripheral circuit 230 at least comprises an input/output circuit 221, a control circuit 222, a register 223, a voltage generator 224, a row decoder 225, a column decoder 226 and a page buffer 227 as shown in FIG. 2, and other circuits. The peripheral circuit 220 or the peripheral circuit 230 may be configured to receive a request from the controller 100 that is used to instruct to determine data of the memory cells coupled with the first word line.

The memory system 10 provided by the examples of the present application may be applied to the above-mentioned memory 200 to achieve the functions and effects of the above-mentioned memory 200. Since detailed description has been made in the aforementioned examples of the memory 200, it is not repeated any longer here.

Figure 16:
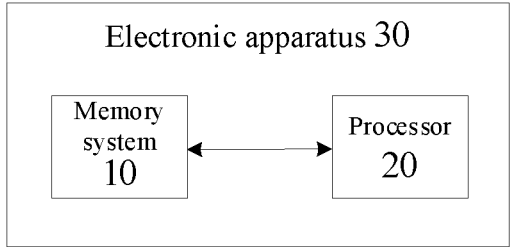
FIG. 16 is a schematic structure diagram of an electronic apparatus provided by examples of the present application.

Examples of the present application further provide an electronic apparatus. The structure of the electronic apparatus may refer to FIG. 16. The electronic apparatus 30 may comprise a processor 20 and one or more memory systems 10 of FIG. 1. The processor 20 may be coupled with the memory systems 10 by a bus. The memory system 10 of the electronic apparatus 30 may comprise the above-mentioned controller 100 and the memory 200. The memory 200 may comprise the peripheral circuit 220 or the peripheral circuit 230 in the above examples, and may also comprise a plurality of word lines and a plurality of rows of memory cells, wherein each row of the memory cells is coupled with one of the word lines. The peripheral circuit 220 or the peripheral circuit 230 may be configured to perform the corresponding method in the above method examples.

The electronic apparatus 30 may be a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatuses having memories therein.

The electronic apparatus 30 provided by the examples of the present application may be applied to the above-mentioned memory 200 to achieve the functions and effects of the above-mentioned memory 200. Since detailed description has been made in the aforementioned examples of the memory 200, it is not repeated any longer here.

Base on such understanding, examples of the present application further provide a computer readable storage medium comprising instructions. The technical solution of the present application is essentially embodied in a form of a software product, or the portion contributing to the existing technology or all or part of the technical solution may be embodied in a form of a software product. The computer software product is stored in a storage medium, comprising several instructions to make a computer apparatus (which may be a personal computer, a server, or a network apparatus, or the like) or peripheral circuit 220 or peripheral circuit 230 in a memory system execute operations S110 and S120 in the method examples of the present application, and all or part of other corresponding method operations.

It is to be understood that, reference throughout this specification to "some examples" means that particular features, structures, or characteristics related to the examples are included in at least one example of the present disclosure. Thus, the appearances of the phrase "in some examples" or "in some other examples" in various places throughout this specification are not necessarily referring to the same example. Furthermore, these particular features, structures, or characteristics may be incorporated in one or more examples in any suitable manner. It is to be understood that, in various examples of the present disclosure, sequence numbers of the above processes do not indicate an execution sequence, and the execution sequence of various processes shall be determined by functionalities and intrinsic logics thereof, and shall constitute no limitation on the implementation process of examples of the present disclosure. The above sequence numbers of examples of the present disclosure are only for description, and do not represent advantages or disadvantages of the examples.

It is to be noted that, the terms "comprise", "include" or any variants thereof herein are intended to cover non-exclusive inclusion, such that a process, a method, an article or a device comprising a series of elements comprise not only those elements, but also other elements not listed explicitly, or elements inherent to this process, method, article or device. Without more limitations, an element defined by a phrase "comprising one" do not preclude the presence of another identical element in the process, method, article or device comprising this element.

In several examples provided by the present disclosure, it should be understood that the disclosed apparatus and method may be implemented in other ways. The apparatus examples as described above are only illustrative, for example, the division of the units is only a logical function division, and there may be other division methods in actual implementation. For instance, a plurality of units or components may be combined, or may be integrated in another system, or some features can be ignored or not performed. In addition, the coupling or direct coupling or communication connection between various composition parts as shown or as discussed may be implemented through indirect coupling or communication connection of some interfaces, apparatuses or units, and may be in electrical, mechanical or other forms.

The above-mentioned units described as separate components may or may not be physically separated. The components shown as units may or may not be physical units. They may be located in one place, or may be distributed onto a plurality of network units. According to actual needs, part or all of the units may be selected for achieving objectives of the solution of the example.

In addition, various functional units in each example of the present disclosure may be all integrated into one processing unit, or each unit may serve as one unit individually, or two or more units may be integrated into one unit. The above-mentioned integrated unit may be implemented in a hardware form or in a form of hardware and software functional units.

Examples of the present application provide a memory, an operation method thereof, and a memory system, which solve the problem of high probability of data misreading.

In order to achieve the above objectives, the present application adopts the following technical solution:

In a first aspect, a memory is provided, which comprises a peripheral circuit, a plurality of word lines and a plurality of rows of memory cells. Each row of the memory cells is coupled with one of the word lines. The peripheral circuit is configured to apply a first voltage to a first word line of the plurality of word lines in each of a plurality of first time periods. A second voltage is applied to the first word line in a second time period between every two adjacent ones of the plurality of first time periods, wherein the second voltage is configured to turn on the memory cells coupled with the first word line.

In the above technical solution, a first voltage is applied to the first word line of the plurality of word lines in each of the plurality of first time periods, and a second voltage is applied to the first word line in the second time period between every two adjacent ones of the plurality of first time periods, and the second voltage is configured to turn on the memory cells coupled with the first word line. An overcharge voltage of the memory cells coupled with the first word line is increased to "the second voltage configured to turn on the memory cells coupled with the first word line". As such, in an aspect, the channel can be better cleared. In another aspect, the voltage on the first word line can reach the first voltage quickly, thereby reducing voltage rising time and shortening read time. In yet another aspect, random telegraph noise can be reduced, thereby increasing threshold edge sum (ESUM), reducing probability of data misreading and improving data reliability. In still another aspect, this solution only needs to change the timing of electrical control, without increasing hardware costs.

In one possible implementation of the first aspect, the second voltages applied in each of the second time periods are all equal. In the above possible implementation, the second voltages applied in each of the second time periods are all equal. As such, the same voltage source may be used to provide the second voltage, without increasing hardware costs.

In one possible implementation of the first aspect, the peripheral circuit is further configured to apply a pre-pulse voltage to the first word line before applying a first one of the first voltages, wherein the second voltage applied in at least one of the second time periods is equal to the pre-pulse voltage. In the above possible implementation, the pre-pulse voltage is applied to the first word line before applying the first one of the first voltages, wherein the second voltage applied in at least one of the second time periods is equal to the pre-pulse voltage. As such, the same voltage source can be used to provide the pre-pulse voltage and the second voltage, without increasing hardware costs.

In one possible implementation of the first aspect, the peripheral circuit is further configured to apply a recovery pulse voltage to the first word line after applying a last one of the first voltages, wherein the second voltage applied in at least one of the second time periods is equal to the recovery pulse voltage. In the above possible implementation, the recovery pulse voltage is applied to the first word line after applying the last one of the first voltages, wherein the second voltage applied in at least one of the second time periods is equal to the recovery pulse voltage. As such, the same voltage source can be used to provide the recovery pulse voltage and the second voltage, without increasing hardware costs.

In one possible implementation of the first aspect, the first voltage is configured to read data of the memory cells coupled with the first word line. In the above possible implementation, the first voltage is configured to read the data of the memory cells coupled with the first word line. Therefore, the solution may be applied to an application scenario where the memory reads data. During reading of the data of the memory cells coupled with the first word line, the channel is better cleared, the read time is shortened, and the data reliability is improved.

In one possible implementation of the first aspect, the first voltage is configured to verify the data of the memory cells coupled with the first word line during programming. In the above possible implementation, the first voltage is configured to verify the data of the memory cells coupled with the first word line during programming. Therefore, the solution may be applied to an application scenario where the memory verifies data during programming. During verifying of the data of the memory cells coupled with the first word line, the channel is better cleared, the read time is shortened, and the data reliability is improved.

In one possible implementation of the first aspect, the plurality of first voltages increase sequentially. In the above possible implementation, the plurality of first voltages increase sequentially. As such, the solution may be applied to an application scenario of forward reading or forward verifying. During the process of forward reading or forward verifying, the channel is better cleared, the read time is shortened, and the data reliability is improved.

In one possible implementation of the first aspect, the plurality of word lines further include a second word line that is adjacent to the first word line. The peripheral circuit is further configured to apply a third voltage to the second word line in each of the first time periods, wherein the third voltage is configured to turn on the memory cells coupled with the second word line. A fourth voltage is applied to the second word line in each of the second time periods, wherein the fourth voltage is less than the third voltage. In the above possible implementation, the third voltage is applied to the second word line adjacent to the first word line in each of the first time periods, and the fourth voltage less than the third voltage is applied to the second word line in each of the second time periods. Since the second word line will be coupled by the first word line in each of the second time periods (when the first word line is overcharged), in fact, the voltage of the second word line will increase. By reducing the voltage applied to the second word line in the second time periods, the read Vpass disturb caused by the coupling of the second word line and the first word line is cancelled, and the ESUM and E0 of the memory cells coupled with the second word line are prevented from decreasing, wherein E0 refers to a space between a corresponding threshold voltage at a peak number of the memory cells in an erase state and a read voltage corresponding to the memory cells in the erase state, thus ensuring the data reliability of the memory.

In one possible implementation of the first aspect, the plurality of word lines further include a third word line that is not adjacent to the first word line. The peripheral circuit is further configured to apply a fifth voltage to the third word line in each of the first time periods and each of the second time periods, wherein the fifth voltage is configured to turn on the memory cells coupled with the third word line. In the above possible implementation, the fifth voltage is applied to the third word line not adjacent to the first word line, and is configured to turn on the memory cells coupled with the third word line. As such, the memory cells coupled with the third word line can be turned on to provide a basis for a bit line to detect current.

In a second aspect, a memory is provided, which comprises a peripheral circuit, a plurality of word lines and a plurality of rows of memory cells. Each row of the memory cells is coupled with one of the word lines. The peripheral circuit is configured to apply a first voltage to a first word line of the plurality of word lines in each of a plurality of first time periods. A second voltage is applied to the first word line in a second time period between every two adjacent ones of the plurality of first time periods, wherein the second voltages applied in each of the second time periods are all equal.

In the above technical solution, a first voltage is applied to the first word line of the plurality of word lines in each of the plurality of first time periods, and a second voltage is applied to the first word line in the second time period between every two adjacent ones of the plurality of first time periods, wherein the second voltages applied in each of the second time periods are all equal. As such, in an aspect, the channel can be better cleared. In another aspect, the voltage on the first word line can reach the first voltage quickly, thereby reducing voltage rising time and shortening read time. In yet another aspect, the random telegraph noise can be reduced, thereby increasing the ESUM, reducing the probability of data misreading and improving the data reliability. In still another aspect, this solution only needs to change the timing of electrical control, and the same voltage source can be used to provide the second voltage, without increasing hardware costs.

In one possible implementation of the second aspect, the second voltages applied in each of the second time periods are greater than any first voltage adjacent to the second voltage. In the above possible implementation, the second voltages applied in each of the second time periods are greater than any first voltage adjacent to the second voltage. The second voltage is increased to "be greater than the maximum one of the plurality of first voltages", so as to provide a basis for increasing the second voltage to achieve effects of clearing the channel, shortening the read time and improving the data reliability, etc.

In one possible implementation of the second aspect, the second voltage is configured to turn on the memory cells coupled with the first word line. In the above possible implementation, the second voltage is configured to turn on the memory cells coupled with the first word line. An overcharge voltage of the memory cells coupled with the first word line is increased to "the second voltage configured to turn on the memory cells coupled with the first word line", to provide a basis for increasing the overcharge voltage to achieve effects of clearing the channel, shortening the read time and improving the data reliability, etc.

In one possible implementation of the second aspect, the peripheral circuit is further configured to apply a pre-pulse voltage to the first word line before applying a first one of the first voltages, wherein the second voltage applied in at least one of the second time periods is equal to the pre-pulse voltage. In the above possible implementation, the pre-pulse voltage is applied to the first word line before applying the first one of the first voltages, wherein the second voltage applied in at least one of the second time periods is equal to the pre-pulse voltage. As such, the same voltage source can be used to provide the pre-pulse voltage and the second voltage, without increasing hardware costs.

In one possible implementation of the second aspect, the peripheral circuit is further configured to apply a recovery pulse voltage to the first word line after applying a last one of the first voltages, wherein the second voltage applied in at least one of the second time periods is equal to the recovery pulse voltage. In the above possible implementation, the recovery pulse voltage is applied to the first word line after applying the last one of the first voltages, wherein the second voltage applied in at least one of the second time periods is equal to the recovery pulse voltage. As such, the same voltage source can be used to provide the recovery pulse voltage and the second voltage, without increasing hardware costs.

In one possible implementation of the second aspect, the first voltage is configured to read data of the memory cells coupled with the first word line. In the above possible implementation, the first voltage is configured to read the data of the memory cells coupled with the first word line. Therefore, the solution may be applied to an application scenario where the memory reads data. During reading of the data of the memory cells coupled with the first word line, the channel is better cleared, the read time is shortened, and the data reliability is improved.

In one possible implementation of the second aspect, the first voltage is configured to verify the data of the memory cells coupled with the first word line during programming. In the above possible implementation, the first voltage is configured to verify the data of the memory cells coupled with the first word line during programming. Therefore, the solution may be applied to an application scenario where the memory verifies data during programming. During verifying of the data of the memory cells coupled with the first word line, the channel is better cleared, the read time is shortened, and the data reliability is improved.

In one possible implementation of the second aspect, the plurality of first voltages increase sequentially. In the above possible implementation, the plurality of first voltages increase sequentially. As such, the solution may be applied to an application scenario of forward reading or forward verifying. During the process of forward reading or forward verifying, the channel is better cleared, the read time is shortened, and the data reliability is improved.

In one possible implementation of the second aspect, the plurality of word lines further include a second word line that is adjacent to the first word line. The peripheral circuit is further configured to apply a third voltage to the second word line in each of the first time periods, wherein the third voltage is configured to turn on the memory cells coupled with the second word line. A fourth voltage is applied to the second word line in each of the second time periods, and is configured to turn on the memory cells coupled with the second word line. The fourth voltage is less than the third voltage. In the above possible implementation, the third voltage is applied to the second word line adjacent to the first word line in each of the first time periods, and the fourth voltage less than the third voltage is applied to the second word line in each of the second time periods. Since the second word line will be coupled by the first word line in each of the second time periods (when the first word line is overcharged), in fact, the voltage of the second word line will increase. By reducing the voltage applied to the second word line in the second time periods, the read Vpass disturb caused by the coupling of the second word line and the first word line is cancelled, and the ESUM and E0 of the memory cells coupled with the second word line are prevented from decreasing, wherein E0 refers to a space between a corresponding threshold voltage at a peak number of the memory cells in an erase state and a read voltage corresponding to the memory cells in the erase state, thus ensuring the data reliability of the memory.

In one possible implementation of the second aspect, the plurality of word lines further include a third word line that is not adjacent to the first word line. The peripheral circuit is further configured to apply a fifth voltage to the third word line in each of the first time periods and each of the second time periods, wherein the fifth voltage is configured to turn on the memory cells coupled with the third word line. In the above possible implementation, the fifth voltage is applied to the third word line not adjacent to the first word line, and is configured to turn on the memory cells coupled with the third word line. As such, the memory cells coupled with the third word line can be turned on to provide a basis for a bit line to detect current.

In a third aspect, a method of operating a memory is provided. The memory comprises a peripheral circuit, a plurality of word lines and a plurality of rows of memory cell. Each row of the memory cells is coupled with one of the word lines. The method comprises applying a first voltage to a first word line of the plurality of word lines in each of a plurality of first time periods. A second voltage is applied to the first word line in a second time period between every two adjacent ones of the plurality of first time periods, wherein the second voltage is configured to turn on the memory cells coupled with the first word line.

In one possible implementation of the third aspect, the second voltages applied in each of the second time periods are all equal.

In one possible implementation of the third aspect, the method further comprises: applying a pre-pulse voltage to the first word line before applying a first one of the first voltages, wherein the second voltage applied in at least one of the second time periods is equal to the pre-pulse voltage.

In one possible implementation of the third aspect, the method further comprises: applying a recovery pulse voltage to the first word line after applying a last one of the first voltages, wherein the second voltage applied in at least one of the second time periods is equal to the recovery pulse voltage.

In one possible implementation of the third aspect, the plurality of first voltages increase sequentially.

In one possible implementation of the third aspect, the plurality of word lines further include a second word line that is adjacent to the first word line. The method further comprises: applying a third voltage to the second word line in each of the first time periods, wherein the third voltage is configured to turn on the memory cells coupled with the second word line. A fourth voltage is applied to the second word line in each of the second time periods, and is configured to turn on the memory cells coupled with the second word line. The fourth voltage is less than the third voltage.

In one possible implementation of the third aspect, the plurality of word lines further include a third word line that is not adjacent to the first word line. The method further comprises: applying a fifth voltage to the third word line in each of the first time periods and each of the second time periods, wherein the fifth voltage is configured to turn on the memory cells coupled with the third word line.

In a fourth aspect, a method of operating a memory is provided. The memory comprises a peripheral circuit, a plurality of word lines and a plurality of rows of memory cell. Each row of the memory cells is coupled with one of the word lines. The method comprises applying a first voltage to a first word line of the plurality of word lines in each of a plurality of first time periods. A second voltage is applied to the first word line in a second time period between every two adjacent ones of the plurality of first time periods, wherein the second voltages applied in each of the second time periods are all equal.

In one possible implementation of the fourth aspect, the second voltages applied in each of the second time periods are greater than any first voltage adjacent to the second voltage.

In one possible implementation of the fourth aspect, the second voltage is configured to turn on the memory cells coupled with the first word line.

In one possible implementation of the fourth aspect, the method further comprises: applying a pre-pulse voltage to the first word line before applying a first one of the first voltages, wherein the second voltage applied in at least one of the second time periods is equal to the pre-pulse voltage.

In one possible implementation of the fourth aspect, the method further comprises: applying a recovery pulse voltage to the first word line after applying a last one of the first voltages, wherein the second voltage applied in at least one of the second time periods is equal to the recovery pulse voltage.

In one possible implementation of the fourth aspect, the plurality of first voltages increase sequentially.

In one possible implementation of the fourth aspect, the plurality of word lines further include a second word line that is adjacent to the first word line. The method further comprises: applying a third voltage to the second word line in each of the first time periods, wherein the third voltage is configured to turn on the memory cells coupled with the second word line. A fourth voltage is applied to the second word line in each of the second time periods, and is configured to turn on the memory cells coupled with the second word line. The fourth voltage is less than the third voltage.

In a fifth aspect, a memory system is provided, which comprises a controller and the memory provided by the above first aspect or any possible implementation of the first aspect.

In a sixth aspect, a memory system is provided, which comprises a controller and the memory provided by the above second aspect or any possible implementation of the second aspect.

In a seventh aspect, an electronic apparatus is provided, which comprises a processor and the memory system provided by the above fifth aspect.

In an eighth aspect, an electronic apparatus is provided, which comprises a processor and the memory system provided by the above sixth aspect.

In yet another aspect of the present application, a computer readable storage medium is provided. When running on a computer, the computer readable storage medium makes the computer perform the method of operating the memory provided by the third aspect or any possible implementation of the third aspect.

In still another aspect of the present application, a computer readable storage medium is provided. When running on a computer, the computer readable storage medium makes the computer perform the method of operating the memory provided by the fourth aspect or any possible implementation of the fourth aspect.

It may be understood that any of the operation method of the memory system, the memory system, the electronic apparatus or the computer readable storage medium provided above may be applied to the above-mentioned memory, or achieve corresponding functions through the memory. Therefore, the advantageous effects that are achievable may refer to the advantageous effects in the corresponding memory provided above, which is no longer repeated here.

At last, it is to be noted that, the above descriptions are merely specific examples of the present application, and the protection scope of the present application is not limited to those. Any variation or replacement within the technical scope as disclosed by the present application shall be encompassed within the protection scope of the present application. Therefore, the protection scope of the present application shall be subject to the protection scope of the claims.

What is claimed is:

1. A memory, comprising a peripheral circuit, a first word line, and a row of memory cells, the row of the memory cells coupled with the first word line, and the peripheral circuit is to:
apply a first voltage to the first word line in a first time period; and
apply a second voltage to the first word line in a second time period between two consecutive ones of the first time period, wherein a magnitude of the second voltage decreases after the two consecutive ones of the first time period, and wherein the second voltage is to turn on the row of memory cells coupled with the first word line.

2. The memory of claim 1, wherein the second voltage applied in second time periods are equal.

3. The memory of claim 1, wherein the peripheral circuit is to apply a pre-pulse voltage to the first word line before applying the first voltage, wherein the second voltage applied in the second time period is equal to the pre-pulse voltage.

4. The memory of claim 1, wherein the peripheral circuit is to apply a recovery pulse voltage to the first word line after applying the first voltage, wherein the second voltage applied in the second time period is equal to the recovery pulse voltage.

5. The memory of claim 1, wherein the first voltage is to read data of the row of memory cells coupled with the first word line.

6. The memory of claim 1, wherein the first voltage is to verify data of the row of memory cells coupled with the first word line during programming.

7. The memory of claim 1, wherein the first voltage increases sequentially.

8. The memory of claim 1, further including a second word line that is adjacent to the first word line, and the peripheral circuit is to:
apply a third voltage to the second word line in the first time period, wherein the third voltage is to turn on the row of memory cells coupled with the second word line; and
apply a fourth voltage to the second word line in the second time period, wherein the fourth voltage is less than the third voltage.

9. The memory of claim 1, further including a third word line that is not adjacent to the first word line, and the peripheral circuit is to apply a fifth voltage to the third word line in the first time period and the second time period, wherein the fifth voltage is to turn on the row of memory cells coupled with the third word line.

10. A memory, comprising a peripheral circuit, word lines, and rows of memory cells, wherein the rows of memory cells are coupled to a word line of the word lines, and the peripheral circuit is to:
apply a first voltage to a first word line in a first time period; and
apply a second voltage to the first word line in a second time period between two consecutive ones of the first time period, wherein a magnitude of the second voltage decreases after the two consecutive ones of the first time period, and wherein second voltages applied in two of the second time periods are equal.

11. The memory of claim 10, wherein the second voltage applied in the second time period is greater than the first voltage.

12. The memory of claim 10, wherein the second voltage is to turn on a row of memory cells of the rows of memory cells coupled with the first word line.

13. The memory of claim 10, wherein the peripheral circuit is to apply a pre-pulse voltage to the first word line before applying the first voltage, wherein the second voltage applied in the second time period is equal to the pre-pulse voltage.

14. The memory of claim 10, wherein the peripheral circuit is to apply a recovery pulse voltage to the first word line after applying the first voltage, wherein the second voltage applied in the second time period is equal to the recovery pulse voltage.

15. The memory of claim 10, wherein the first voltage is to read data of a row of memory cells of the rows of memory cells coupled with the first word line.

16. The memory of claim 10, wherein the first voltage is to verify data of a row of memory cells of the rows of memory cells coupled with the first word line during programming.

17. The memory of claim 10, wherein the first voltage increases sequentially.

18. The memory of claim 10, wherein the word lines further include a second word line that is adjacent to the first word line, and the peripheral circuit is to:
apply a third voltage to the second word line in the first time period, wherein the third voltage is to turn on a row of memory cells of the rows of memory cells coupled with the second word line; and
apply a fourth voltage to the second word line in the second time period, wherein the fourth voltage is less than the third voltage.

19. The memory of claim 10, wherein the word lines further include a third word line that is not adjacent to the first word line, and the peripheral circuit is to apply a fifth voltage to the third word line in the first time period and the second time period, wherein the fifth voltage is to turn on a row of memory cells of the rows of memory cells coupled with the third word line.

20. A memory system, comprising:
a controller, and
a memory comprising a peripheral circuit, word lines, and a row of memory cells, wherein the row of the memory cells is coupled to a word line of the word lines, and the peripheral circuit is to:
apply a first voltage to a first word line in a first time period; and apply a second voltage to the first word line in a second time period between two consecutive ones of the first time period, wherein a magnitude of the second voltage decreases after the two consecutive ones of the first time period, and wherein the second voltage is to turn on the row of memory cells coupled with the first word line.

\* \* \* \* \*